(12) United States Patent
Miura et al.

(10) Patent No.: US 7,538,388 B2
(45) Date of Patent: May 26, 2009

(54) SEMICONDUCTOR DEVICE WITH A SUPER-JUNCTION

(75) Inventors: Yoshinao Miura, Kanagawa (JP); Hitoshi Ninomiya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 117 days.

(21) Appl. No.: 11/483,738

(22) Filed: Jul. 11, 2006

(65) Prior Publication Data
US 2007/0012998 A1 Jan. 18, 2007

(30) Foreign Application Priority Data
Jul. 14, 2005 (JP) .............................. 2005-205645

(51) Int. Cl.
*H01L 23/62* (2006.01)
(52) U.S. Cl. ........................ 257/331; 257/341; 257/328; 257/339; 257/E29.013
(58) Field of Classification Search ................. 257/500, 257/328, 341–342, E29.257, E29.264, E29.013, 257/331
See application file for complete search history.

(56) References Cited
U.S. PATENT DOCUMENTS
2001/0028083 A1* 10/2001 Onishi et al. ................. 257/328

2005/0184336 A1* 8/2005 Takahashi et al. ........... 257/328

FOREIGN PATENT DOCUMENTS
JP  2001-298190  10/2001

* cited by examiner

*Primary Examiner*—Tucker Wright
(74) *Attorney, Agent, or Firm*—Young & Thompson (57) ABSTRACT

A semiconductor device has a semiconductor substrate, and a parallel p-n layer provided between the main surface and the back surface of the semiconductor substrate, and first-conductivity-type drift region and second-conductivity-type partition regions alternately arranged therein, wherein in the parallel p-n layer, the second-conductivity-type partition regions are periodically formed conforming to a basic periodicity specified by a predetermined distance, and $S_A/S$ (where, $S_A$ is a sectional area per a single second-conductivity-type partition region as viewed in a plane parallel with the main surface, and S is a sectional area of a unit structural region, periodically formed as containing one of the second-conductivity-type partition regions, as viewed in a plane parallel with the main surface) in an element-forming region allowing current to flow therethrough is smaller than $S_A/S$ in at least a portion of a periphery region surrounding the element-forming region.

8 Claims, 5 Drawing Sheets

SEMICONDUCTOR DEVICE WITH A SUPER-JUNCTION

This application is based on Japanese patent application No. 2005-205645 the content of which is incorporated hereinto by reference.

DISCLOSURE OF THE INVENTION

1. Field of the Invention

The present invention relates to a semiconductor device, and in particular to a semiconductor device having a super-junction structure.

2. Related Art

In general, semiconductor devices are roughly classified into those of lateral type having an electrode section on one surface thereof, and those of vertical type having electrode sections on both surfaces thereof. In particular, the vertical-type semiconductor device, adopting a trench-gate structure which has a channel formed vertically in a wafer, is ready to reduce the cell size and can further increase the ON-current as compared with the lateral-type device having a channel formed in the surficial region of the wafer. In thus-configured, vertical-type semiconductor device, both of the direction of flow of drift current in the ON state and the direction of extension of a depletion layer induced by a reverse bias voltage in the OFF state are aligned in the thickness-wise direction of the substrate (vertical direction). In the vertical-type semiconductor device allowing current to flow between the electrodes provided on two opposing main surfaces, it has been necessary for the high-resistivity layer between both electrodes to be increased in the specific resistance, and to be thickened, if higher breakdown voltage is desired. A semiconductor device having a higher breakdown voltage therefore had a tendency of showing a larger ON-resistance.

In order to realize low ON-resistance, it is necessary to increase an impurity concentration of a drift region allowing the drift current to flow therethrough, or to reduce the thickness of the drift region. This, however, results in lowering in the breakdown voltage because the depletion layer produced in the OFF state is thinned. As is clear from the above, breakdown voltage and ON-resistance are in a trade-off relation. In view of realizing downsizing of a low-power-consumption device, it is necessary to realize low ON-resistance while keeping the breakdown voltage of the device unchanged.

In recent years, there has been proposed a semiconductor device using so-called super junction, as a device realizing such low power consumption. An example of this sort of semiconductor device is disclosed in Japanese Laid-Open Patent Publication (JP-A) 2001-298190. In the super junction structure, the drift region, composed of an element-forming portion allowing current to flow therethrough, has a parallel p-n structure having vertical laminar n-type regions and vertical laminar p-type partition regions alternately arranged therein to thereby form a multiple junction, rather than a single electro-conductive layer. The structure is not only successful in lowering the ON-resistance by virtue of increased impurity concentration in the drift portion, but also in achieving high breakdown voltage because the depletion layers along the individual p-n junctions expand in the lateral direction to thereby deplete the entire range of the drift portion.

On the other hand, as the breakdown voltage is raised by adopting the super junction structure, it has been becoming more difficult to design a structure capable of ensuring high breakdown voltage in the periphery region around the element-forming region. The above-described JP-A-2001-298190 proposes a structure having the parallel p-n junction structure, which is a characteristic feature of the super junction structure, extended not over the element-forming region, but also into the periphery region. Exemplary techniques disclosed herein include lowering the impurity concentration of the high-breakdown-voltage structural region than that in the drift region, while keeping the p-n repetition pitch equal both in the drift region which is an element-forming region and in a high-breakdown-voltage region therearound (FIGS. 1(a) and 1(b) of the above-described JP-A-2001-298190); widening (FIGS. 4(a) and 4(b) of the above-described JP-A-2001-298190) or narrowing (FIG. 7 of the above-described JP-A-2001-298190) the p-n repetition pitch in the high-breakdown-voltage structural region than that in the drift region, while equalizing the impurity concentrations of both regions, so as to realize a semiconductor device having a high breakdown voltage and a low ON-resistance. In all of these cases, the parallel p-n layer is one-dimensionally formed according to a stripe pattern in a plan view.

SUMMARY OF THE INVENTION

By the way, it has been known that a semiconductor device, having a super junction structure in which the p-type partition regions in the p-n repetitive region are two-dimensionally arranged, is lower in the ON-resistance than the semiconductor device based on the one-dimensional arrangement. It is therefore preferable that the semiconductor device can ensure high breakdown voltage in the periphery structure thereof, while adopting the two-dimensional arrangement of the p-type partition regions.

The technique described in JP-A-2001-298190 realizes a high breakdown voltage by varying the pitch of the one-dimensional arrangement of the stripe-patterned, p-type partition regions. Any effort of applying this idea to a semiconductor device having the p-type partition regions two-dimensionally arranged therein, however, raises difficulty in designing, for example, a layout of the p-type partition regions, proving difficulty in directly applying the idea of stripe-patterned semiconductor device. It has therefore been difficult to realize high breakdown voltage in the periphery region of the semiconductor device having the super junction structure in which the p-type partition regions are two-dimensionally arranged.

According to the present invention, there is provided a semiconductor device comprising:

a semiconductor substrate;

a first-conductivity-type drift regions region formed in said semiconductor substrate;

a plurality of second conductivity type base regions formed in an upper part of said first-conductivity-type drift region; and a plurality of second-conductivity-type partition regions formed beneath said second-conductivity-type base region and arranged in said first-conductivity-type drift region, said second-conductivity-type partition regions being periodically formed in said first-conductivity-type drift region at a specified distance, and $S_A/S$ (where, $S_A$ is a sectional area per a single second-conductivity-type partition region as viewed in a plane parallel with said main surface, and S is a sectional area of a unit structural region, periodically formed as containing one of said second-conductivity-type partition regions, as viewed in a plane parallel with said main surface) in an element-forming region allowing current to flow therethrough is smaller than $S_A/S$ in at least a portion of a periphery region surrounding said element-forming region.

According to the semiconductor device of the present invention, the second-conductivity-type partition regions are periodically formed conforming to a basic periodicity specified by a predetermined distance, and thereby the second-conductivity-type partition regions are formed with an equal pitch over the entire range. In addition, a ratio ($S_A/S$) of area occupied by the second-conductivity-type partition region per unit structural region, composed of a single second-conductivity-type partition region and the first-conductivity-type drift region therearound, is set larger in the periphery region than in the element-forming region, so that the second-conductivity-type partition region in the periphery region will be larger than the second-conductivity-type partition region in the element-forming region. By combining both of these features, area of the first-conductivity-type drift region per a unit structural region will be larger in the element-forming region than in the periphery region. It is, therefore, made possible to raise the breakdown voltage in the periphery region than in the element-forming region, so that a lower ON-resistance is obtainable in the element-forming region, while successfully raising the breakdown voltage of the semiconductor device.

The present invention can therefore provide a semiconductor device well-balanced between high breakdown voltage and low ON-resistance, and high in the ruggedness.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will detail embodiments of the semiconductor device of the present invention, referring to the attached drawings. In the drawings, the same number refers to the same element so as to omit the overlapping explanation.

FIRST EMBODIMENT

Figure 1A:
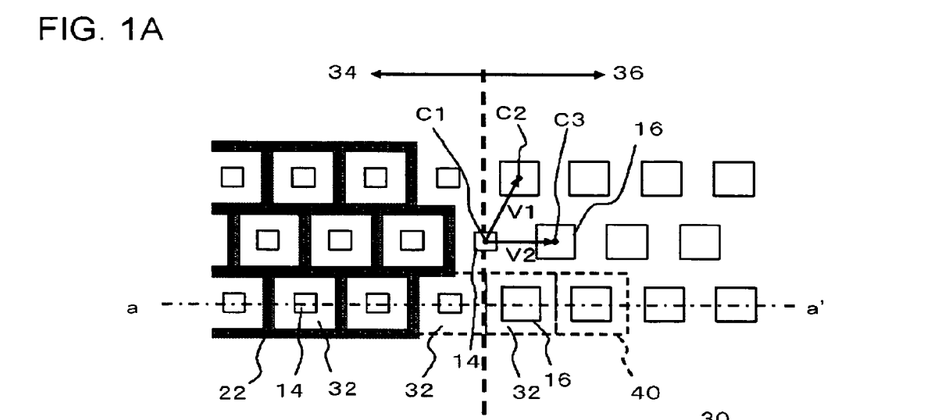
FIG. 1A and FIG. 1B are a plan view and a fragmentary sectional view, respectively, showing a configuration of the outermost portion of a semiconductor device of a first embodiment.
Figure 1B:
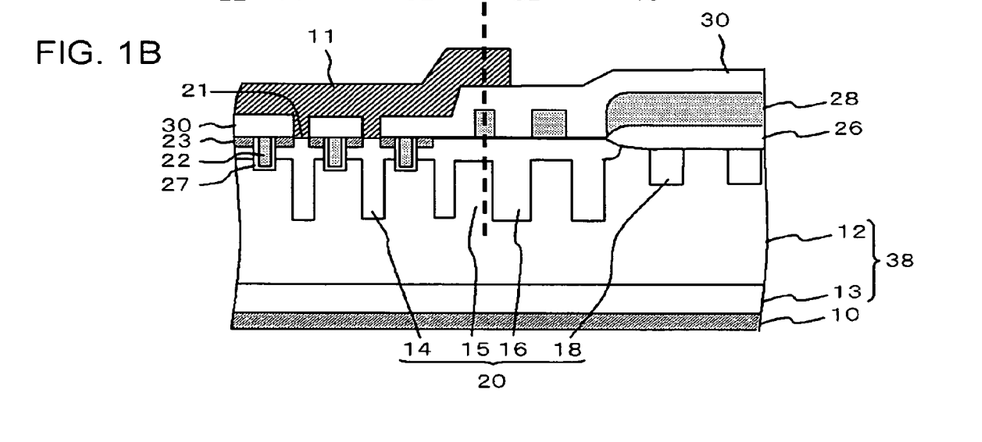

FIG. 1A is a plan view of a configuration of the outermost portion of the semiconductor device of a first embodiment, and FIG. 1B is a sectional view taken along line a-a' in FIG. 1A.

As shown in FIG. 1A and FIG. 1B, the first embodiment includes a semiconductor substrate 38; a first-conductivity-type drift region (corresponding to n-type semiconductor layer 15) formed in said semiconductor substrate 38; a plurality of second conductivity type base regions formed in an upper part of said first-conductivity-type drift region; and a plurality of second-conductivity-type partition regions (corresponding to p-type semiconductor layers 14, 16, 18) formed beneath said second-conductivity-type base region and arranged in said first-conductivity-type drift region, said second-conductivity-type partition regions being periodically formed in said first-conductivity-type drift region at a specified distance, and $S_A/S$ (where, $S_A$ is a sectional area per a single second-conductivity-type partition region as viewed in a plane parallel with said main surface, and S is a sectional area of a unit structural region, periodically formed as containing one of said second-conductivity-type partition regions, as viewed in a plane parallel with said main surface) in an element-forming region allowing current to flow therethrough is smaller than $S_A/S$ in at least a portion of a periphery region surrounding said element-forming region.

That is, the first embodiment includes a semiconductor substrate 38, and a parallel p-n layer 20 provided between the main surface and the back surface of the semiconductor substrate 38, and having first-conductivity-type drift region and second-conductivity-type partition regions alternately arranged therein.

In the parallel p-n layer 20, the second-conductivity-type partition regions are periodically formed conforming to a basic periodicity specified by a predetermined distance, and $S_A/S$ (where, $S_A$ is a sectional area per a single second-conductivity-type partition region as viewed in a plane parallel with the main surface, and S is a sectional area of a unit structural region 32, periodically formed as containing one of the second-conductivity-type partition regions, as viewed in a plane parallel with the main surface) of an element-forming region 34 allowing current to flow therethrough is smaller than $S_A/S$ in at least a portion of the periphery region 36 surrounding the element-forming region 34.

The semiconductor substrate 38 herein is composed of a high concentration n-type ($n^+$-type) semiconductor substrate 13, and an epitaxial layer 12 formed by allowing silicon to epitaxially grow on the surface of the $n^+$-type semiconductor substrate 13, while being doped with phosphorus for example. The semiconductor substrate 38 has a source electrode 11 formed on the main surface thereof, and has a drain electrode 10 formed on the back surface thereof.

The parallel p-n layer 20 has an n-type semiconductor layer 15 as the first-conductivity-type drift region which allows current to flow therethrough in the ON state, and is depleted in the OFF state, and p-type semiconductor layers 14, 16 and 18 as the second-conductivity-type partition regions alternately disposed therewith. Each of these p-type semiconductor layers 14, 16 and 18 have a columnar form as shown in FIG. 1B, aligned in the thickness-wise direction of the semiconductor substrate, and two-dimensionally arranged in a plan view as shown in FIG. 1A.

A field oxide film 26 is formed so as to surround the parallel p-n layer 20, a field electrode 28 composed of polysilicon is formed so as to cover the field oxide film 26, and an interlayer insulating film 30 is further formed so as to cover the field electrode 28. It is well enough for the field electrode 28 to cover the field oxide film 26, so that the effects of the present invention are obtainable even if the field electrode 28 is not electrically connected to the p-type semiconductor layers 18 of the parallel p-n layer 20 which fall in the periphery region 36.

The p-type semiconductor layers 16 are also provided in the periphery region 36 on the element-forming region side of the field oxide film 26, and adjacent ones of the p-type semiconductor layers 16 and the p-type semiconductor layers 14 in the element-forming region 34 forms a p-base. The p-type semiconductor layers 18 and the p-type semiconductor layers 16 are not connected.

On the other hand, the n-type semiconductor layer 15 is connected with a gate electrode 22 in a region where a trench is formed, source regions 23 are formed around the gate electrode 22 in the semiconductor substrate 38 in the vicinity of the main surface thereof, and an interlayer insulating film 30 is formed on the surface of each source region 23. Between every adjacent interlayer insulating films 30 thus partitioned, a p-contact 21 allowing therein connection between the source electrode 11 and the p-type semiconductor layer 14 is formed. The region where the p-type semiconductor layers 14, composing the p-base, are formed is referred to as the element-forming region 34, because current flows therethrough depending on voltage applied through the gate electrode 22.

In the ON state of thus-configured semiconductor device, a channel is formed in the p-base, specifically in a portion in contact with the gate electrode 22 and between the source region 23 and the n-type semiconductor layer 15, so that current flows from the source electrode 11 towards the drain electrode 10. Whereas in the OFF state, the depletion occurs in the parallel p-n layer 20 specifically at the junction portions between the n-type semiconductor layer 15 and the p-type semiconductor layers 14, 16 and 18, so that the depletion regions expand in the n-type semiconductor layer 15 between the adjacent p-type semiconductor layers 14, 16 and 18.

The OFF state referred to herein means a state in which no voltage is applied through the gate electrode 22, so that the junction portion has no current flowing therethrough, but applied with voltage applied between the source and the drain. The ON state means a state in which voltage is applied through the gate electrode 22 so as to invert the p-base and to lower the resistance, so that the voltage applied between the source and the drain also becomes extremely low, to thereby allow current to flow through the junction portion.

Procedures of fabricating the semiconductor device shown in FIG. 1 will now be explained referring to FIGS. 2A to 2C.

Figure 2A:
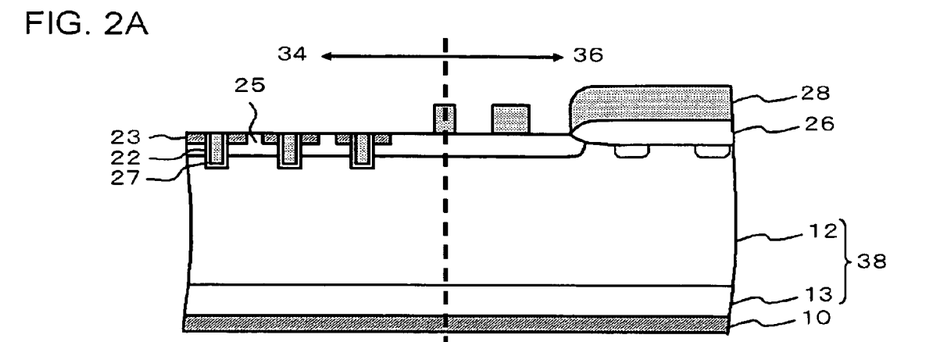
FIGS. 2A to 2C are sectional views sequentially showing process steps of fabricating the semiconductor device of the first embodiment.

First, as shown in FIG. 2A, on the main surface of the high concentration $n^+$-type semiconductor substrate 13, silicon is allowed to epitaxially grow while being doped, for example, with phosphorus (P), to thereby form the epitaxial layer 12. In the periphery region 36, an element-isolating region is then formed on the surface of the epitaxial layer 12. The element-isolating region may be subjected to, for example, the LOCOS (local oxidation of silicon) process based on thermal oxidation to thereby form the field oxide film.

Next, boron (B) for example is implanted into the surficial portion of the epitaxial layer 12, to thereby form a base region 25, as a p-type semiconductor layer, in the region other than the element-isolating region.

The surface of the epitaxial layer 12 is then selectively etched with the aid of a photolithographic technique, to thereby form a trench. A silicon oxide film, although not shown, is then formed on the inner wall of the trench and the surface of the n-type semiconductor layer 15 by thermal oxidation. The portion of the silicon oxide film formed on the surface of the epitaxial layer 12 is then removed, so that the remaining silicon oxide film in the trench refers to the gate insulating film 27. A polysilicon layer is then formed in the trench and on the surface of the epitaxial layer 12 by the CVD (chemical vapor deposition) process. The polysilicon layer is then anisotropically etched so as to leave the film only in the trench and in a predetermined region on the epitaxial layer, and so as to remove the residual portion, with the aid of a photolithographic technique. By the procedures, the gate electrode 22 and the field electrode 28 having a pattern shown in FIG. 2A are formed.

Arsenic (As) ion, for example, is then implanted with the aid of a photolithographic technique to thereby form the high concentration n-type ($n^+$-type) source region 23 around the gate electrode 22 in the surficial portion of the base region 25.

Figure 2B:
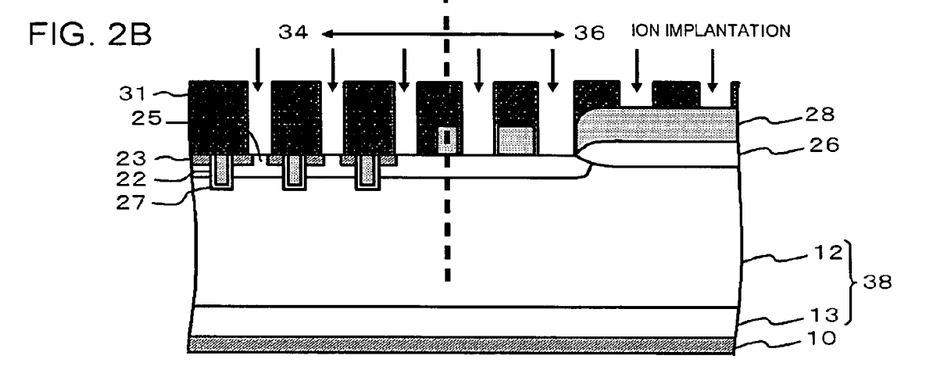

Next, as shown in FIG. 2B, a mask 31 having a predetermined geometry is formed, and boron (B) ion for example is then implanted into the surficial portion of the epitaxial layer 12 through the mask 31 (FIG. 2B). The mask 31 has openings corresponding to the p-type semiconductor layers 14, 16 and 18 to be formed, so that the ion implantation through the mask 31 can make the sectional area of the p-type semiconductor layers as viewed in the direction normal to the depth-wise direction thereof larger in the periphery region 36 than in the element-forming region 34, and can make the dose of impurity contained in the p-type semiconductor layers formed by the ion implantation larger in the unit structural region 32 in the periphery region 36 than in the unit structural region 32 of the element-forming region 34. The ion implantation may be accomplished by two or larger number of times of processes, under varied energy. The mask 31 is then removed by etching (FIG. 2C). In this embodiment, the p-type semiconductor layers 14, 16 and 18 are formed only to a depth never reaching the $n^+$-type semiconductor substrate 13 which functions as the drain region, and are formed so as to hold the n-type semiconductor layer 15 between every adjacent ones of the p-type semiconductor layers 14, 16 and 18, together composing the parallel p-n layer 20.

An insulating film is then formed on the surface of the epitaxial layer 12, and patterned according to a predetermined geometry, to thereby form the interlayer insulating film 30. Next, an electrode layer is formed typically by sputtering using, for example, an aluminum target. The electrode layer is then patterned according to a predetermined geometry to thereby form the source electrode 11. Also on the back surface of the semiconductor substrate 38, the drain electrode 10 is formed by the similar sputtering process. By the process, the semiconductor device configured as shown in FIGS. 1A and 1B is obtained.

Although the description in the above has shown a case where the field electrode 28 was formed before the p-type semiconductor layer 18 was formed, there is no special limitation on the sequential order of other procedures, for example, which of the base regions, the source region 23 and the field electrode 28 should be formed prior to the others. These constituents may be formed according to an order different from that described in the above.

In the parallel p-n layer 20, as shown in FIG. 1A, the p-type semiconductor layers 14, 16 and 18 are formed so as to have a columnar form, and are periodically formed conforming to a basic periodicity specified by the distance V1 (size of vector V1) between the center C1 of the p-type semiconductor layer 14 and the center C2 of the adjacent p-type semiconductor layer 16, and by the distance V2 (size of vector V2) between the above-described center C1 and the center C3 of another adjacent p-type semiconductor layer 16. In other words, the individual p-type semiconductor layers 14, 16 and 18 have a columnar form, and are two-dimensionally arranged while keeping a constant pitch both in the element-forming region 34 and in the periphery region 36. The p-type semiconductor layers 14, 16 and 18 are arranged according to a square lattice pattern in a plan view when vectors V1 and V2 cross normal to each other, and according to a rhombic lattice pattern when the vectors cross obliquely. In view of readiness in formation of the trench-formed gate electrode 22, and of minimizing effects of concentration of current at the intersections of the gate electrode 22, it is preferable to arrange the p-type semiconductor layers 14, 16 and 18 according to the rhombic lattice pattern.

By forming the p-type semiconductor layer so as to make $S_A/S$ in the element-forming region 34 larger than $S_A/S$ in the periphery region 36, and by combining the strategy with the above-described feature, a ratio of area occupied by the p-type semiconductor layers per unit structural region 32 is set larger in the periphery region 36 than in the element-forming region 34, and a ratio of area occupied by the n-type semiconductor layer 15 is set larger in the element-forming region 34 than in the periphery region 36.

Figure 3:
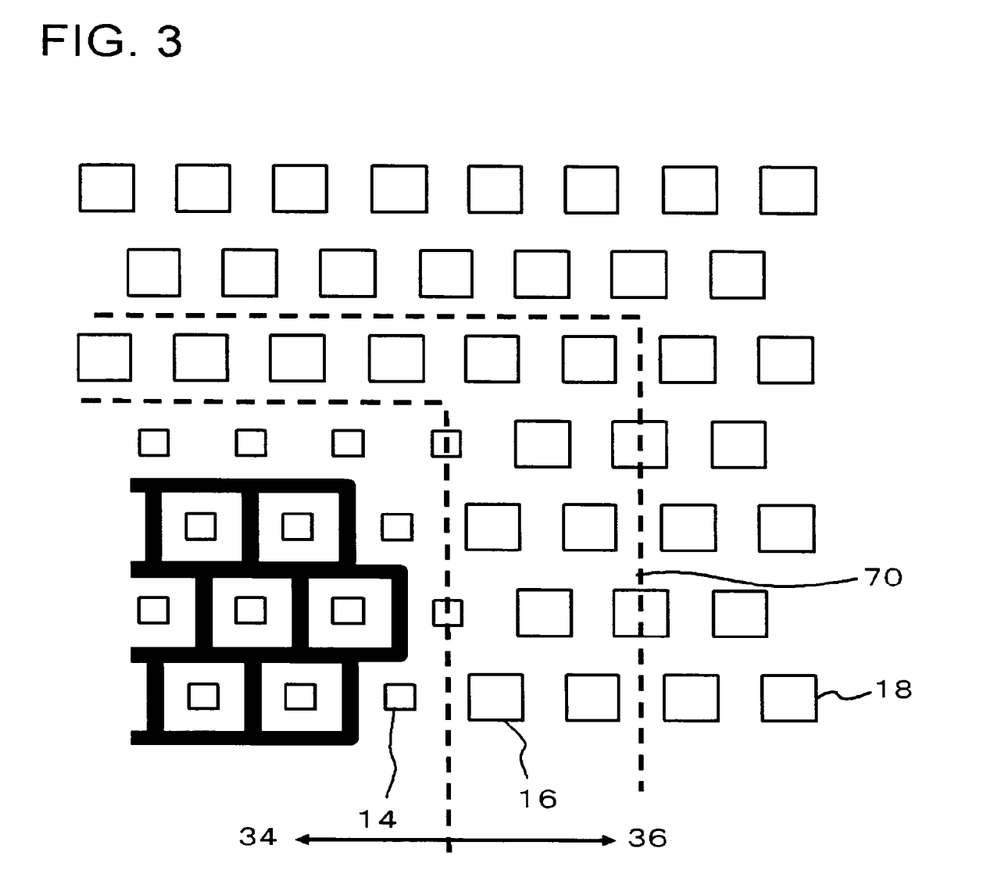
FIG. 3 is a plan view showing a configuration of the first embodiment.

As for arrangement of the p-type semiconductor layers in the periphery region 36, all values of $S_A/S$ in the periphery region 36 may be set larger than $S_A/S$ in the element-forming region 34. In other words, as shown in FIG. 3, it is allowable to form the p-type semiconductor layers 16, 18 having $S_A/S$ larger than that of the p-type semiconductor layers 14 in the element-forming region 34, outwardly from the boundary between the element-forming region 34 and the periphery region 36. FIG. 3 shows an exemplary case where the p-type semiconductor layers 16, 18 of the same size are formed both inside and outside of the end face 70 of the field oxide film 26.

Figure 4:
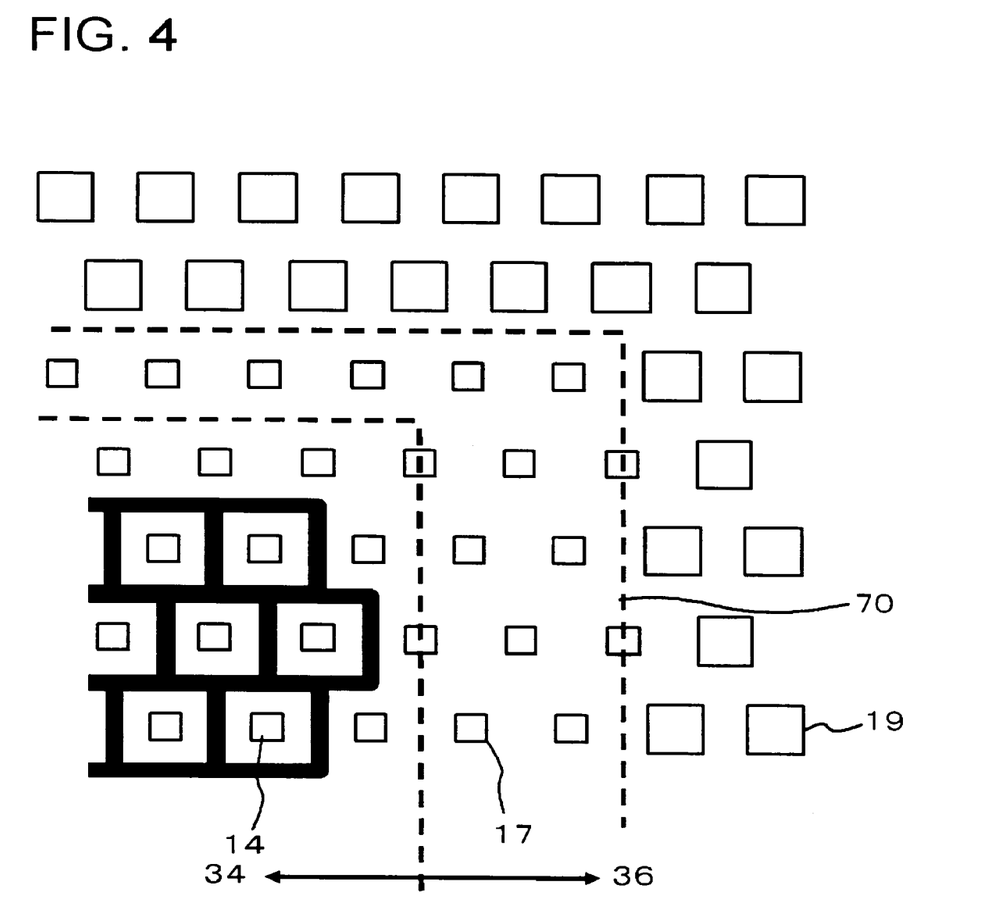
FIG. 4 is a plan view showing another modified example of the first embodiment.

For the case where the periphery region 36 has the field oxide film provided in a portion thereof, it is also allowable, typically as shown in FIG. 4, to form p-type semiconductor layers 19 having $S_A/S$ larger than that of the p-type semiconductor layers 14 in the element-forming region 34 in a portion of the periphery region 36, for example outwardly from the end face 70 of the field oxide film 26, and to form p-type semiconductor layers 17 having $S_A/S$ equal to that of the p-type semiconductor layers 14 in the element-forming region 34 in a region ranging from the boundary between the element-forming region 34 and the periphery region 36 to the end face 70 of the field oxide film 26.

Although not illustrated in the drawings, it is also allowable to form the p-type semiconductor layers so that $S_A/S$ gradually increases in the direction from the boundary between the element-forming region 34 and the periphery region 36 towards the end face 70 of the field oxide film 26 (or the end portion of the semiconductor device). It is still also allowable to form the p-type semiconductor layers having $S_A/S$ larger than that of the p-type semiconductor layers in the element-forming region 34 in a portion of the periphery region 36, typically in a region ranging from the boundary between the element-forming region 34 and the periphery region 36 to the end face 70 of the field oxide film 26, and to form the p-type semiconductor layers having $S_A/S$ equivalent to that of the p-type semiconductor layers in the element-forming region 34, in the region outside the end face 70 of the field oxide film 26.

The unit structural region 32 is characterized by a pattern including at least one p-type semiconductor layer, by which a plane can be covered without producing a gap therebetween. The explanation in the above was made on an exemplary case where the unit structural region 32 was a region including only a single p-type semiconductor layer and had a square geometry in a plan view as shown in the drawing, wherein the geometry is not limited to square but allows rectangle, hexagon and so forth.

Japanese Laid-Open Patent Publication 2001-298190 discloses a technique intending to realize a semiconductor device having a high breakdown voltage and a low ON resistance, by forming the p-type partition regions two-dimensionally in a plan view, and by setting the occupational area and pitch of the p-type partition regions larger in the drift region than in the high-voltage structural region (FIG. 17). The two-dimensional arrangement of the p-type partition regions is, however, likely to produce sites of concentration of electric field, when the pitch is varied between the high-voltage structural region and the drift region, and makes it difficult to realize high breakdown voltage at these sites.

In contrast to this, the semiconductor device of this embodiment shows, in the periphery region, a characteristic maximum of breakdown voltage ascribable to the super junction structure, and has, in the element-forming region, a structure capable of reducing the ON-resistance than in the periphery region, or a structure allowing current to more readily flow. A semiconductor device well balanced between high breakdown voltage and low ON-resistance, and high in the ruggedness can therefore be provided. In other words, it is made possible to raise the breakdown voltage in the periphery region than in the element-forming region, to thereby improve the ruggedness of the semiconductor device, and further to realize low ON-resistance in the element-forming region.

SECOND EMBODIMENT

Figure 5A:
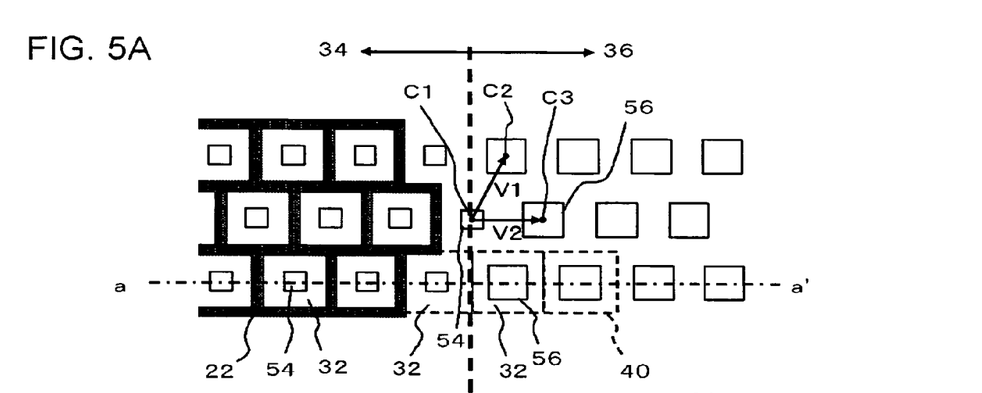
FIG. 5A and FIG. 5B are a plan view and a fragmentary sectional view, respectively, showing a configuration of the outermost portion of a semiconductor device of a second embodiment.
Figure 5B:
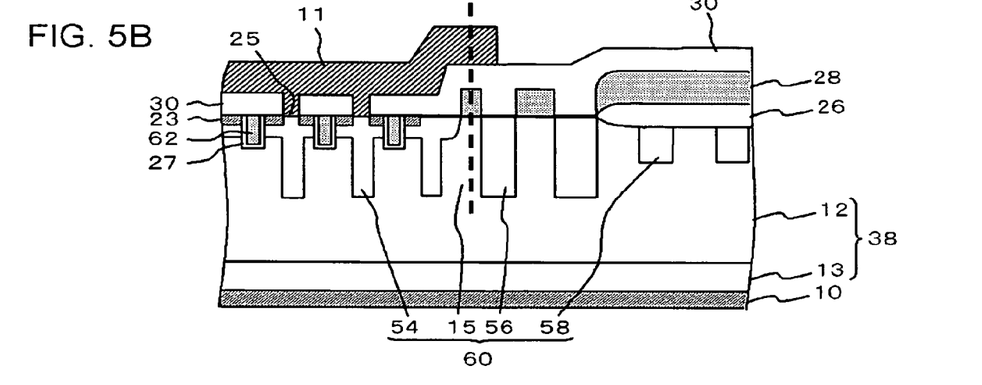

FIG. 5A is a plan view showing a configuration of the outermost portion of a semiconductor device of a second embodiment, and FIG. 5B is a sectional view taken along line a-a' in FIG. 5A.

As shown in FIG. 5A, the second embodiment is similar to the first embodiment explained referring to FIG. 1, except that there is no base region provided between the p-type semiconductor layers 56, and between the p-type semiconductor layer 56 and the outermost p-type semiconductor layer 54 in the element-forming region 34, in the region ranging from the boundary between the element-forming region 34 and the periphery region 36 to the field oxide film 26. In other words, in a parallel p-n layer 60, the base region is formed only between every adjacent p-type semiconductor layers 54 in the element-forming region 34, but not formed between every adjacent p-type semiconductor layers 56, 58 in the periphery region 36.

Figure 2C:
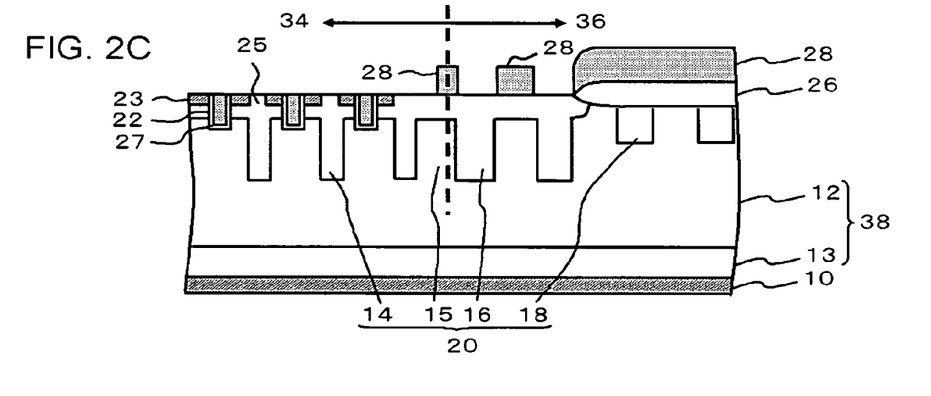

The semiconductor device of this embodiment can be fabricated similarly according to a method of fabricating the semiconductor device of the first embodiment, except that a mask, used for impurity implantation for forming the p-type semiconductor layers in the process steps shown in FIGS. 2A to 2C, is replaced with a mask having openings respectively corresponded to the width of the p-type semiconductor layers to be formed.

Also the semiconductor device of this embodiment can successfully raise the breakdown voltage in the periphery region than in the element-forming region, and can thereby improve the ruggedness of the semiconductor device similarly to the first embodiment, and can further realize low ON-resistance in the element-forming region.

The foregoing paragraphs have described the embodiments of the semiconductor device, without limiting the present invention. For example, each of the individual embodiments has explained the semiconductor device having the super junction structure which makes use of the n-type semiconductor substrate having the partition regions composed of the p-type semiconductor layers formed in the drift region composed of the n-type semiconductor layer, whereas it is a matter of course that also a semiconductor device having the n-type and p-type semiconductor layers exchanged therein can yield the same effects of the present invention.

While the foregoing paragraphs have described the semiconductor device of vertical trench type, the present invention is applicable also to semiconductor devices of planar type.

While the embodiments of the semiconductor device explained in the above exemplified a power MOSFET, the semiconductor device is not limited thereto, and the same effects are obtainable if it is configured as IGBT, p-n diode or bipolar transistor.

It is apparent that the present invention is not limited to the above embodiment, that may be modified and changed without departing from the scope and spirit of the invention.

The following shows one embodiment of the present invention.

The embodiment may be a semiconductor device including a semiconductor substrate; and a parallel p-n layer provided between the main surface and the back surface of the semiconductor substrate, and having first-conductivity-type drift region and second-conductivity-type partition regions alternately arranged therein, wherein in the parallel p-n layer, the second-conductivity-type partition regions are periodically formed conforming to a basic periodicity specified by a predetermined distance, and $S_A/S$ (where, $S_A$ is a sectional area per a single second-conductivity-type partition region as viewed in a plane parallel with the main surface, and S is a sectional area of a unit structural region, periodically formed as containing one of the second-conductivity-type partition regions, as viewed in a plane parallel with the main surface) in an element-forming region allowing current to flow therethrough is smaller than $S_A/S$ in at least a portion of a periphery region surrounding the element-forming region.

What is claimed is:

1. A semiconductor device comprising:
   a semiconductor substrate;
   a first-conductivity-type drift region formed in said semiconductor substrate;
   a plurality of second conductivity type base regions formed in an upper part of said first-conductivity-type drift region; and
   a plurality of second-conductivity-type partition regions formed beneath said second-conductivity-type base region and arranged in said first-conductivity-type drift region,
   said second-conductivity-type partition regions being periodically formed in said first-conductivity-type drift region at a specified distance, and
   $S_A/S$ (where, $S_A$ is a sectional area per a single second-conductivity-type partition region as viewed in a plane parallel with said/ main surface, and S is a sectional area of a unit structural region, periodically formed as containing one of said second-conductivity-type partition regions, as viewed in a plane parallel with said main surface) in an element-forming region allowing current to flow therethrough is smaller than $S_A/S$ in at least a portion of a periphery region surrounding said element-forming region,
   wherein each of said second-conductivity-type partition regions has a columnar form, aligned in the thickness-wise direction of said semiconductor substrate, and two-dimensionally arranged in a plan view, and
   wherein said second-conductivity-type partition regions are provided as being arranged according to a rhombic lattice pattern in a plan view.

2. The semiconductor device according to claim 1, wherein all values of $S_A/S$ in the entire portion of said periphery region is larger than $S_A/S$ in said element-forming region.

3. The semiconductor device according to claim 1, wherein said periphery region has a field oxide film provided in a portion thereof, and $S_A/S$ in a region below said field oxide film is larger than $S_A/S$ in said element-forming region.

4. A semiconductor device comprising:
   a semiconductor substrate, said substrate comprising a first-conductivity-type layer and a continuous doped epitaxial layer of said first-conductivity-type formed over said first-conductivity-type layer;
   a drift region of said first-conductivity-type formed in said semiconductor substrate;
   a plurality of second conductivity type base regions formed in an upper part of said first-conductivity-type drift region; and
   a plurality of second-conductivity-type partition regions formed beneath said second-conductivity-type base region and arranged in said first-conductivity-type drift region,
   said second-conductivity-type partition regions being periodically formed in said first-conductivity-type drift region at a specified distance, and
   $S_A/S$ (where, $S_A$ is a sectional area per a single second-conductivity-type partition region as viewed in a plane parallel with said main surface, and S is a sectional area of a unit structural region, periodically formed as containing one of said second-conductivity-type partition regions, as viewed in a plane parallel with said main surface) in an element-forming region allowing current to flow therethrough is smaller than $S_A/S$ in at least a portion of a periphery region surrounding said element-forming region,
   wherein said second-conductivity-type partition regions extend only part way into said drift region without contacting said first-conductivity-type layer.

5. The semiconductor device according to claim 4, wherein each of said second-conductivity-type partition regions has a columnar form, aligned in the thickness-wise direction of said semiconductor substrate, and two-dimensionally arranged in a plan view.

6. The semiconductor device according to claim 4, wherein said second-conductivity-type partition regions are provided as being arranged according to a rhombic lattice pattern in a plan view.

7. The semiconductor device according to claim 4, wherein all values of $S_A/S$ in the entire portion of said periphery region is larger than $S_A/S$ in said element-forming region.

8. The semiconductor device according to claim 4, wherein said periphery region has a field oxide film provided in a portion thereof, and
   $S_A/S$ in a region below said field oxide film is larger than $S_A/S$ in said element-forming region.

* * * * *